(12) United States Patent  (10) Patent No.: US 9,184,527 B2
Rathburn  (45) Date of Patent: Nov. 10, 2015

(54) ELECTRICAL CONNECTOR INSULATOR HOUSING

(75) Inventor: James Rathburn, Maple Grove, MN (US)

(73) Assignee: HSIO TECHNOLOGIES, LLC, Maple Grove, MN (US)

( * ) Notice: Subject to any disclaimer, the term of this patent is extended or adjusted under 35 U.S.C. 154(b) by 3 days.

(21) Appl. No.: 13/700,639

(22) PCT Filed: Jun. 2, 2011

(86) PCT No.: PCT/US2011/038845
§ 371 (c)(1),
(2), (4) Date: Nov. 28, 2012

(87) PCT Pub. No.: WO2011/153298
PCT Pub. Date: Dec. 8, 2011

(65) Prior Publication Data
US 2013/0078860 A1  Mar. 28, 2013

Related U.S. Application Data

(63) Continuation-in-part of application No. 13/266,573, filed as application No. PCT/US2010/036363 on May 27, 2010, now Pat. No. 9,054,097, application No. 13/700,639, which is a continuation of application No.

(Continued)

(51) Int. Cl.
*H01R 13/24* (2006.01)
*H01R 12/70* (2011.01)
(Continued)

(52) U.S. Cl.
CPC .............. *H01R 13/24* (2013.01); *H01R 12/7082* (2013.01); *H01R 13/2421* (2013.01); *H01R 13/66* (2013.01); *H01R 43/20* (2013.01); *H05K 7/1069* (2013.01); *H01R 12/52* (2013.01);
(Continued)

(58) Field of Classification Search
USPC .................. 439/620.01, 66; 257/778, 257
See application file for complete search history.

(56) References Cited

U.S. PATENT DOCUMENTS 3,672,986 A  6/1972  Schneble, Jr. et al.
4,188,438 A  2/1980  Burns
(Continued)

FOREIGN PATENT DOCUMENTS

JP  2003/217774  7/2003
WO  WO 91/14015  9/1991
(Continued)

OTHER PUBLICATIONS

Office Action mailed Oct. 30, 2013 in co-pending U.S. Appl. No. 13/266,486, now published as US Patent Application Publication No. US 2012/0055701.

(Continued)

*Primary Examiner* — Alexander Gilman
(74) *Attorney, Agent, or Firm* — Stoel Rives LLP

(57) ABSTRACT

A socket housing and method of making the socket housing. A plurality of dielectric layers are printed with a plurality of recesses on a substrate. The dielectric layers include at least two different dielectric materials. A sacrificial material is printed in the recesses. The assembly is removed from the substrate and the sacrificial material is removed from the recesses. At least one contact member is located in a plurality of the recesses. Distal ends of the contact members are adapted to electrically couple with circuit members.

15 Claims, 9 Drawing Sheets

Related U.S. Application Data

13/318,200, filed as application No. PCT/US2010/036288 on May 27, 2010, now Pat. No. 9,136,196, application No. 13/700,639, which is a continuation-in-part of application No. 13/320,285, filed as application No. PCT/US2010/036282 on May 27, 2010.

(60) Provisional application No. 61/183,340, filed on Jun. 2, 2009, provisional application No. 61/183,411, filed on Jun. 2, 2009, provisional application No. 61/183,356, filed on Jun. 2, 2009.

(51) Int. Cl.

| H05K 7/10 | (2006.01) |
|---|---|
| H01R 13/66 | (2006.01) |
| H01R 43/20 | (2006.01) |
| H01R 12/52 | (2011.01) |
| H05K 3/36 | (2006.01) |

(52) U.S. Cl.
CPC ............... *H05K3/361* (2013.01); *H05K 3/368* (2013.01); *H05K 2201/0187* (2013.01); *H05K 2201/10378* (2013.01); *Y10T 29/4922* (2015.01)

(56) References Cited

U.S. PATENT DOCUMENTS

| 4,295,700 A | 10/1981 | Sado |
|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,071,363 A | 12/1991 | Reylek et al. |
| 5,072,520 A | 12/1991 | Nelson |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A * | 10/1995 | Beilin et al. ............ 29/852 |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A * | 9/1998 | Card et al. ............ 29/840 |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |

(56) References Cited

U.S. PATENT DOCUMENTS

| | | |
|---|---|---|
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,536,714 B2 | 5/2009 | Yuan |
| 7,537,461 B2 * | 5/2009 | Rathburn ................... 439/66 |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yushio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |

(56) References Cited

U.S. PATENT DOCUMENTS

| | | |
|---|---|---|
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0246136 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | 2008/156856 | 12/2008 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |

(56) References Cited

FOREIGN PATENT DOCUMENTS

| WO | WO-2014/011232 | 1/2014 |
|----|----------------|--------|
| WO | WO-2015/006393 | 1/2015 |

OTHER PUBLICATIONS

Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.

(56) References Cited

OTHER PUBLICATIONS

Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Co-pending U.S. Appl. No. 13/575,368, titled High Speed Backplane Connector, filed Jul. 26, 2012.
Co-pending U.S. Appl. No. 13/643,436 titled Semiconductor Device Package Adapter, filed Oct. 25, 2012.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.

(56) References Cited

OTHER PUBLICATIONS

Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Final Office Action mailed Mar. 16, 2015 in co-pending U.S. Appl. No. 13/320,285 now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.

(56) References Cited

OTHER PUBLICATIONS

Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 01, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.

(56) References Cited

OTHER PUBLICATIONS

Office Action mailed Sep. 4, 2014 in co-pending U.S. Appl. No. 13/319,228, now published as US Patent Application Publication No. US 2012/0058653.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 201 2/01 61 31 7.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary filed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.
Office Action mailed May 22, 2015 in co-pending U.S. Appl. No. 13/880,231, now published as US Patent Application Publication No. 2013/0210276.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.

(56) References Cited

OTHER PUBLICATIONS

Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as U.S. Patent Application No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.

\* cited by examiner

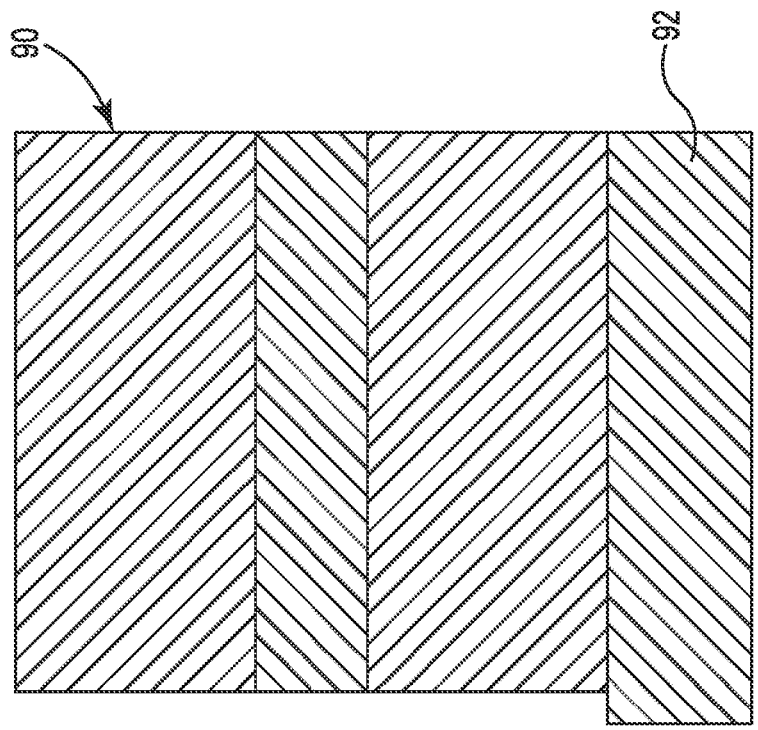
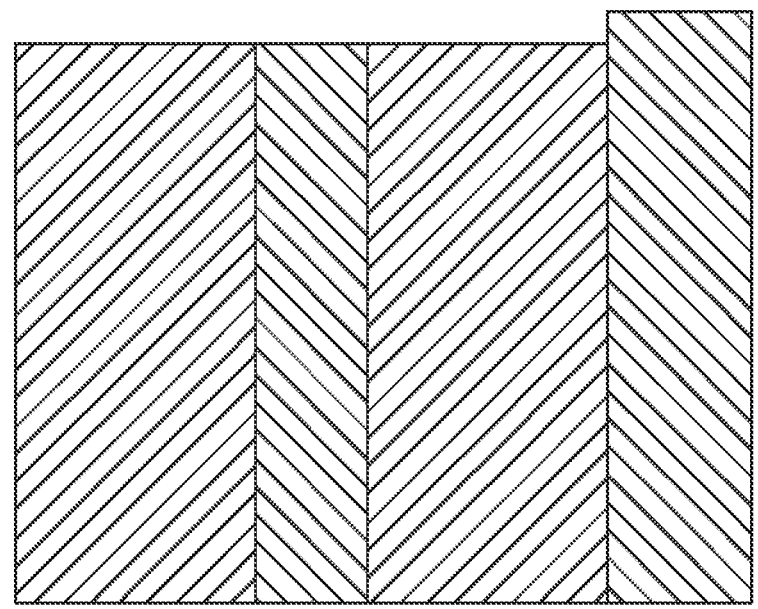
Fig. 4

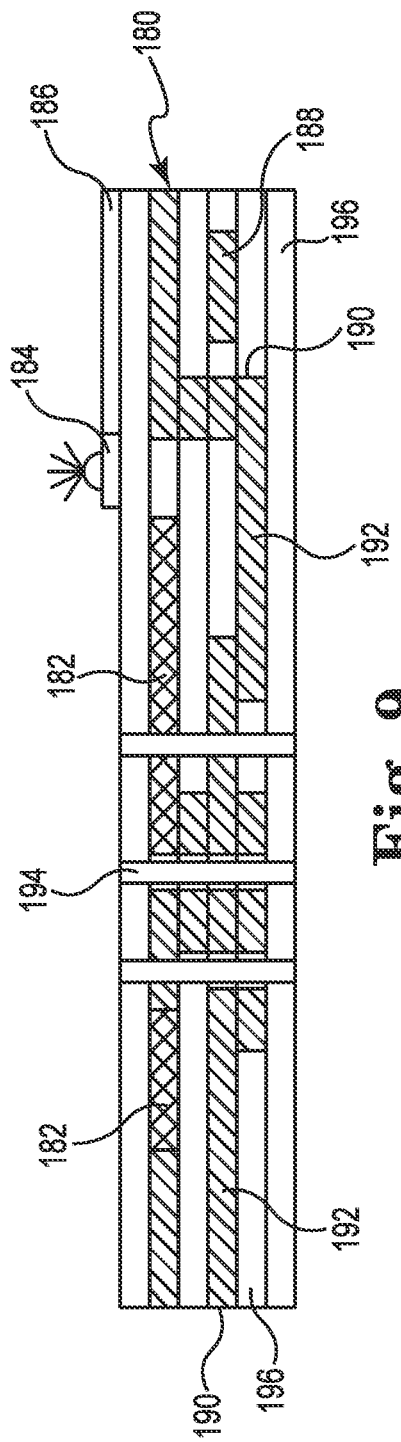
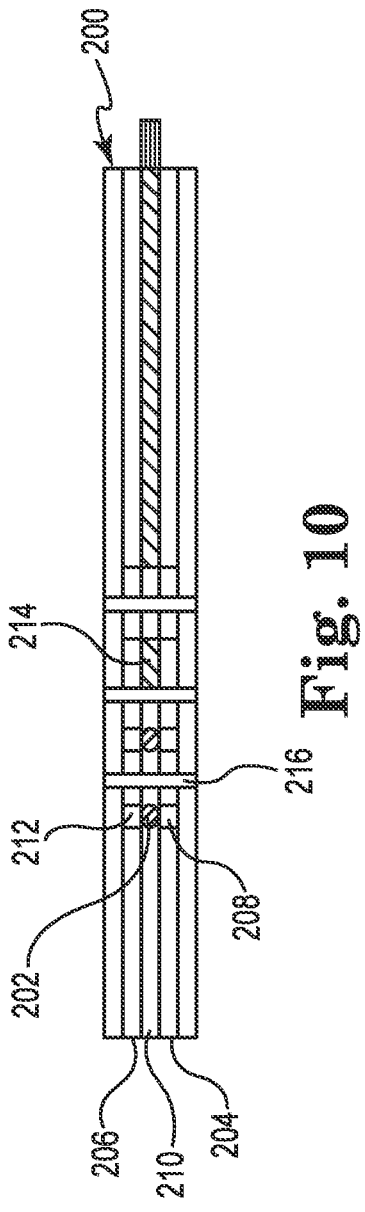

ELECTRICAL CONNECTOR INSULATOR HOUSING

CROSS-REFERENCE TO RELATED APPLICATIONS

This application claims the benefit of a national stage application under 35 U.S.C. §371 of International Application No. PCT/US2011/038845, titled ELECTRICAL CONNECTOR INSULATOR HOUSING, filed Jun. 2, 2011, which claims priority to U.S. Provisional Application No. 61/351,114, filed Jun. 3, 2010, all of which are hereby incorporated by reference in their entireties.

This application is a continuation-in-part of U.S. patent application Ser. No. 13/266,573, titled COMPLIANT PRINTED CIRCUIT AREA ARRAY SEMICONDUCTOR DEVICE PACKAGE, filed Oct. 27, 2011, which is a national stage application under 35 U.S.C. §371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, all of which are hereby incorporated by reference in their entireties.

This application is a continuation-in-part of U.S. patent application Ser. No. 13/318,200, title COMPLIANT PRINTED CIRCUIT WAFER LEVEL SEMICONDUCTOR PACKAGE, filed Oct. 31, 2011, which is a national stage application under 35 U.S.C. §371 of International Application No. PCT/US2010/036288, titled COMPLIANT PRINTED CIRCUIT WAFER LEVEL SEMICONDUCTOR PACKAGE, filed May 27, 2010, which claims priority to U.S. Provisional Application No. 61/183,356, filed Jun. 2, 2009, all of which are hereby incorporated by reference in their entireties.

This application is a continuation-in-part of U.S. patent application Ser. No. 13/320,285, titled COMPLIANT PRINTED FLEXIBLE CIRCUIT, filed Nov. 14, 2011, which is a national stage application under 35 U.S.C. §371 of International Application No. PCT/US2010/036282, titled COMPLIANT PRINTED FLEXIBLE CIRCUIT, filed May 27, 2010, which claims priority to U.S. Provisional Application No. 61/183,340, filed Jun. 2, 2009, all of which are hereby incorporated by reference in their entireties.

TECHNICAL FIELD

The present application relates to an insulator connector socket housing that merges the long-term performance advantages of traditional socket manufacturing techniques with the flexibility of additive printing technology.

BACKGROUND OF THE INVENTION

Connectors and socket housings are typically manufactured by injection molding precision grade polymers, such as ABS, LCP. For smaller volume applications the connectors and socket housings are often precision machined from a dielectric material. Metallic contacts are inserted into the socket housing and retained by some sort of mechanical interference or captured such that they do not fall out during use. In some cases, the contacts are inserted into the mold prior to injection such that the polymer material flows around portions of the contacts.

In both cases, the base material is typically loaded with glass fibers or particles to provide strength and mechanical or dimensional stability. In situations where thermal cycling is present during use or solder reflow attachment, the internal stress within the plastic/glass matrix can cause significant changes in dimension or flatness.

As interconnect products become more sophisticated, with higher pin counts, higher contact density, and higher signal and power integrity requirements, traditional methods of molding and machining are proving inadequate. High density connectors and sockets with fine pitches are very difficult to mold due to thin wall sections and fine features with large aspect ratios. It is also somewhat difficult to change from one configuration to another without producing a new mold. Machined housings are processed from raw stock, and are relatively expensive with long run times and limited capacity.

BRIEF SUMMARY OF THE INVENTION

The present disclosure is directed to a high performance insulator socket housing that will enable next generation electrical performance. The present disclosure merges the advantages of molded or machined socket housings, with the flexibility of additive printing technology. The present insulator socket housing can be produced digitally, without tooling or costly artwork, with dramatic reductions in environmental issues.

The present insulator socket housing is a three-dimensional dielectric-like structure consisting of a variety of dielectric properties. The basic structure can be enhanced with a number of circuit-like properties which can add function far beyond a traditional molded or machined socket housings.

The construction includes of an additive process where layers of dielectric are placed and patterned adjacent to or on previous or subsequent layers. The construction is such that the resultant aggregate of layers creates an insulative structure that replicates the function of a molded or machined housing. The nature of the construction enables features and structures that cannot be molded and/or can be difficult to replicate by machining, such as for example, undercuts and hollows.

Considering the structure as an aggregate of dielectrics also allows for multiple materials to be used within one housing which is difficult or impossible with molding or machining. In addition, the structure can be processed with circuit-like structures to create features and functions not possible with traditional methods such as embedded circuitry, shielding, passive or active components, antennae, decoupling, power filtering, signal conditioning, magnetic or dielectric enhancement, impedance control, transistors, LEDs, test or probe points, memory, and the like.

The present insulator socket housing can be used with virtually any contact members or interconnect type. The contact members can be inserted into the socket housing and/or printed in a variety of shapes and sizes, depending on the terminal structure on the mating circuit members. The contact members can be positioned at a variety of locations, heights, or spacings. In some embodiments, the tips of the contact members are treated with specialty materials to increase long term reliability.

The present socket housing can be manufactured in layers. The use of additive printing processes permits the material set in a given layer to vary. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

Electrical devices can be printed as part of the socket housing, such as for example, ground planes, power planes, transistors, capacitors, resistors, RF antennae, shielding, filters, signal or power altering and enhancing devices, memory devices, embedded IC, and the like. Optical quality materials can also be printed or deposited in recesses to form optical circuit geometries.

The present disclosure is also directed to an electrical interconnect assembly. The socket housing retains electrical contact members that engage with terminals on first and second circuit members. The first and second circuit members are selected from one of a dielectric layer, a printed circuit board, a flexible circuit, a bare die device, an integrated circuit device, organic or inorganic substrates, or a rigid circuit.

The present disclosure is also directed to a method of making a socket housing. A plurality of dielectric layers are printed with a plurality of recesses on a substrate. The dielectric layers include at least two different dielectric materials. A sacrificial material is printed in the recesses. The assembly is removed from the substrate. The sacrificial material is removed from the recesses. At least one contact member is located in a plurality of the recesses. Distal ends of the contact members are adapted to electrically couple with circuit members.

The present disclosure is also directed to a method of making an electrical interconnect assembly. Electrical terminals on a first circuit member are compressively coupled with contact members in the socket housing, and electrical terminals on a second circuit member are compressively coupled with contact members.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the socket housing reduces parasitic electrical effects and impedance mismatch, potentially increasing the current carrying capacity.

The present socket housing can serve as a platform to add passive and active circuit features to improve electrical performance or internal function and intelligence. For example, electrical features and devices are printed onto the socket housing, for example, inkjet printing technology or other printing technologies. The ability to enhance the socket housing, such that it mimics aspects of an IC package and a PCB, allows for reductions in complexity for the IC package and the PCB, while improving the overall performance of the socket housing.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

The socket housing can be configured with conductive traces that reduce or redistribute the terminal pitch, without the addition of an interposer or daughter substrate. Grounding schemes, shielding, electrical devices, and power planes can be added to the socket housing, reducing the number of connections to the PCB and relieving routing constraints while increasing performance.

BRIEF DESCRIPTION OF THE SEVERAL VIEWS OF THE DRAWING

FIG. 4 illustrates an alternate socket housing in accordance with an embodiment of the present disclosure.

FIG. 9 illustrates a socket housing with printed electrical devices in accordance with an embodiment of the present disclosure.

FIG. 10 illustrates a socket housing with optical features in accordance with an embodiment of the present disclosure.

DETAILED DESCRIPTION OF THE INVENTION

An insulator socket housing according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch socket housings are especially useful for communications, wireless, and memory devices.

The present insulator socket housing can be configured as a low cost, high signal performance interconnect assembly, which has a low profile that is particularly useful for desktop and mobile PC applications. IC devices can be installed and uninstalled without the need to reflow solder. The solder-free electrical connection of the IC devices is environmentally friendly.

Figure 1:
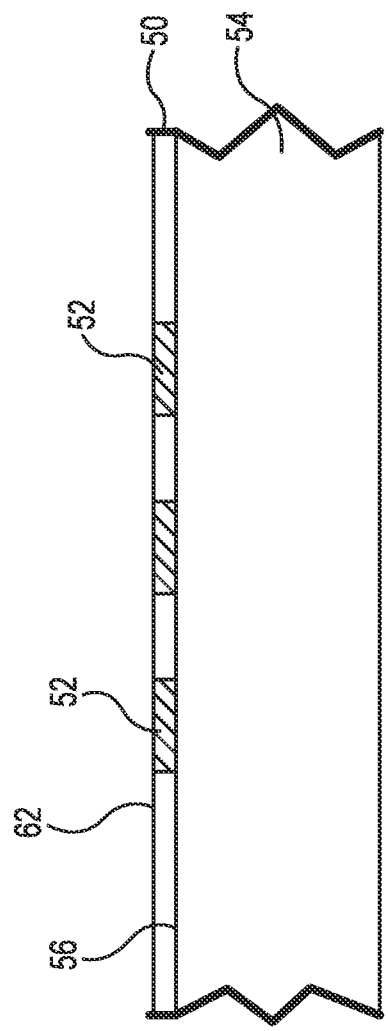
FIG. 1 is a cross-sectional view of a method of making a socket housing in accordance with an embodiment of the present disclosure.

FIG. 1 is a side cross-sectional view of a method for replicating a socket housing using additive processes in accordance with an embodiment of the present disclosure. Dielectric layer 50 and removable or dissolvable material 52 are located on substrate 54 corresponding to a desired contact member configuration. In one embodiment, the dielectric layer 50 and the removable material 52 are printed or placed on surface 56 of the substrate 54. The dielectric layer 50 and the removable material 52 can be applied by printing, embossing, imprinting, chemical etching with a printed mask, or a variety of other techniques. A number of different materials are used as the substrate 54 including: polyester (PET), polyimide (PI), polyethylene napthalate (PEN), Polyetherimide (PEI), along with various fluropolymers (FEP)

and copolymers. Polyimide films are the most prevalent due to their advantageous electrical, mechanical, chemical, and thermal properties.

Figure 2:
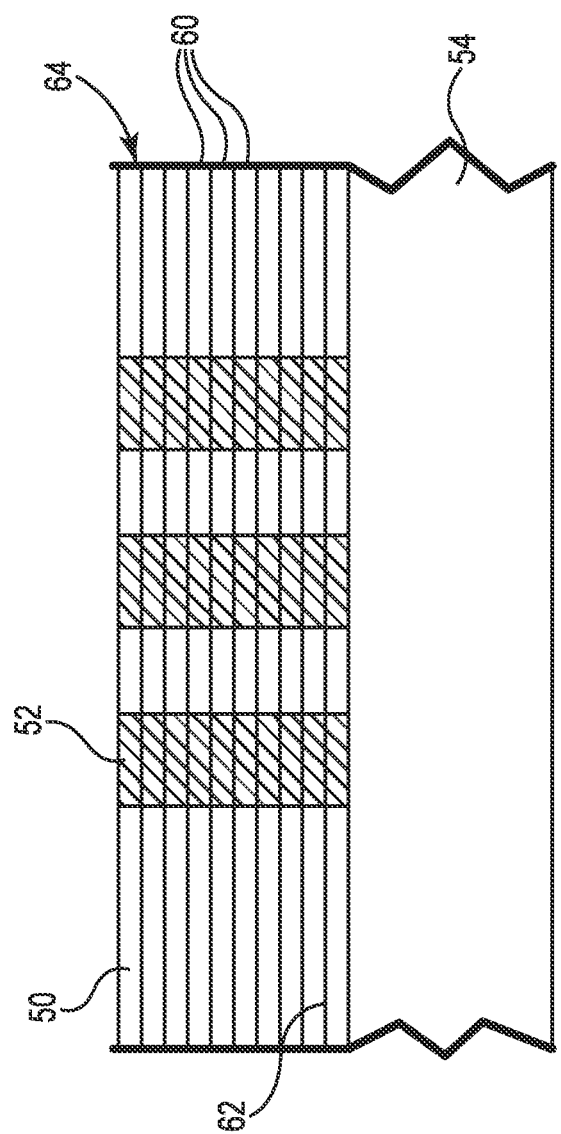
FIG. 2 is a cross-sectional view of the socket housing of FIG. 1.

FIG. 2 illustrates additional layers 60 of dielectric 50 and removable material 52 are added to top surface 62 of each previous layer 60. The socket housing 64 is removed from the substrate 54 and the removable material 52 is then dissolved or otherwise removed.

The dielectric layer 50 can be any of a number of materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the layer 60 are designed to provide electrostatic dissipation or to reduce cross-talk. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 3:
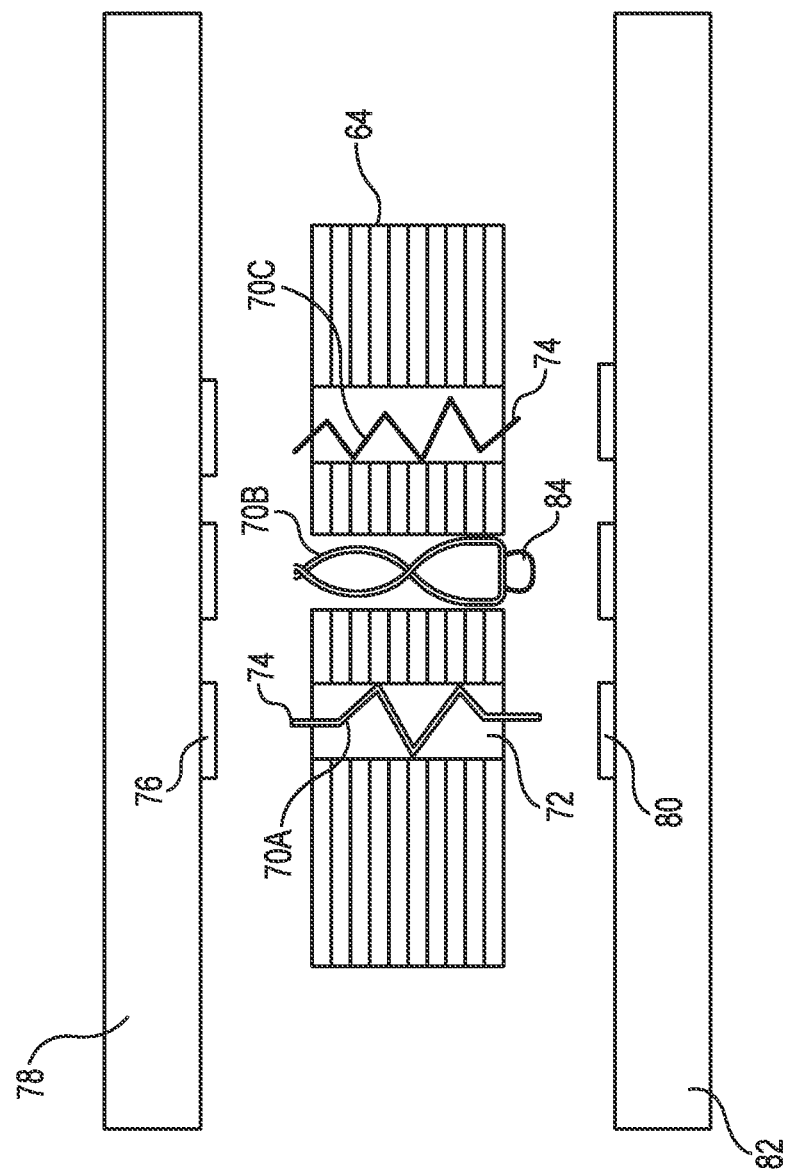
FIG. 3 illustrates the socket housing of FIG. 1 with contact members configured to electrically couple with circuit members in accordance with an embodiment of the present disclosure.

FIG. 3 illustrates the socket housing 64 with the material 52 removed. Various contact members 70A, 70B, 70C (collectively "70") are inserted into recesses 72 formed by removal of the material 52. The contact members 70 can be secured in the socket housing using a variety of techniques, such as adhesives, mechanical interconnect, friction, and the like.

Distal ends 74 of the contact members 70 are configured to electrically couple with terminals 76 on first circuit member 78 and terminals 80 on second circuit member 82. One or more of the distal ends 74 can include solder ball 84 to bond with a terminal on a circuit member 78, 82. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

FIG. 4 illustrates an alternate socket housing 90 made according to an embodiment of the present disclosure. Layer 92 extends into recess 94 that is intended to receive contact member 96 (see FIG. 5).

Figure 5:
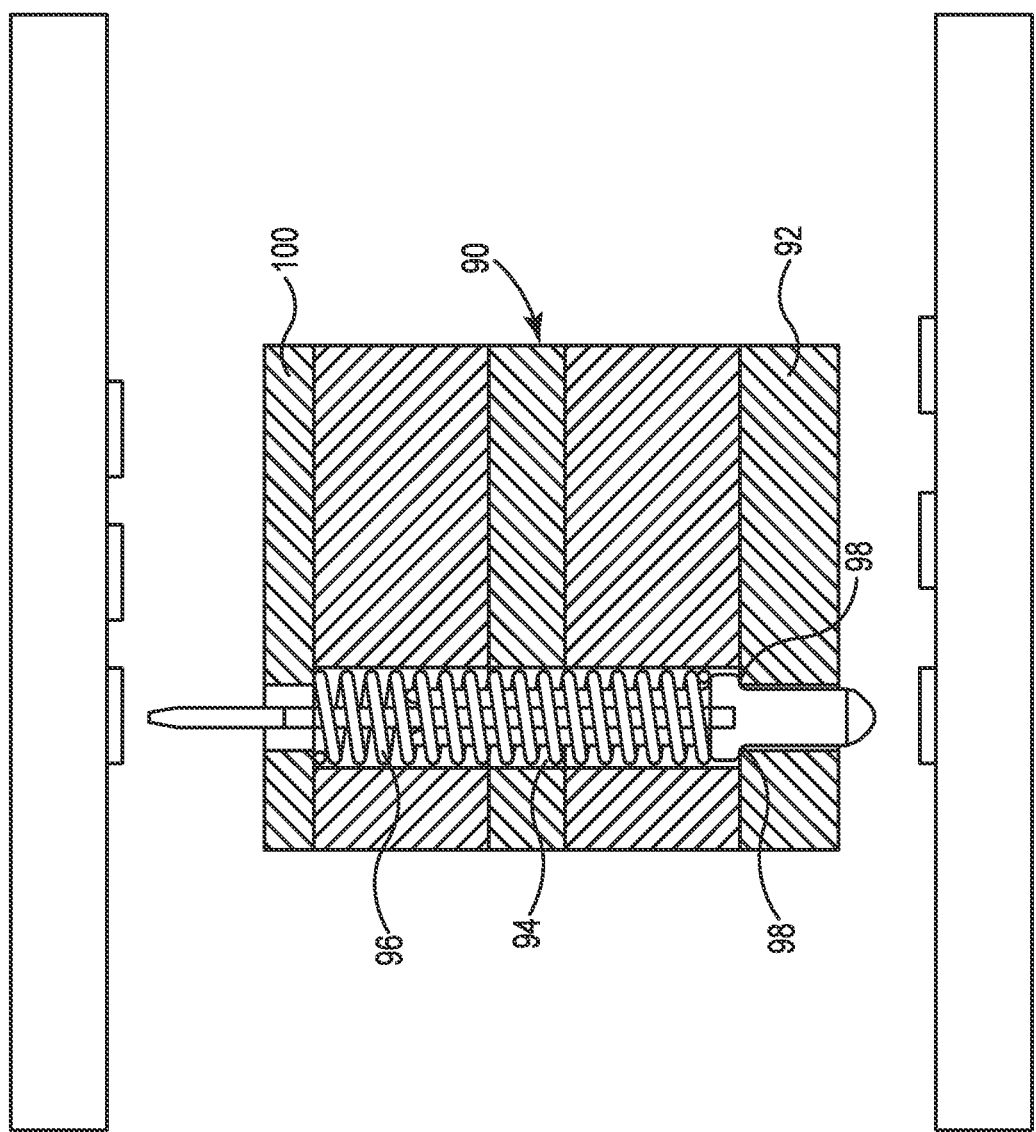
FIG. 5 illustrates the socket housing of FIG. 4 with contact members configured to electrically couple with circuit members in accordance with an embodiment of the present disclosure.

As illustrated in FIG. 5, contact member 96 engages with shoulders 98 on the portion of layer 92 extending into recess 94. After the contact member 96 is positioned in the recess 94, layer 100 is added to the socket housing 90 to capture the contact member 96 in the recess. The layer 100 can be added by printing or can be a preformed layer bonded to the socket housing 90. As used herein, "bond" or "bonding" refers to, for example, adhesive bonding, solvent bonding, ultrasonic welding, thermal bonding, or any other techniques suitable for attaching adjacent layers to a substrate.

Figure 6:
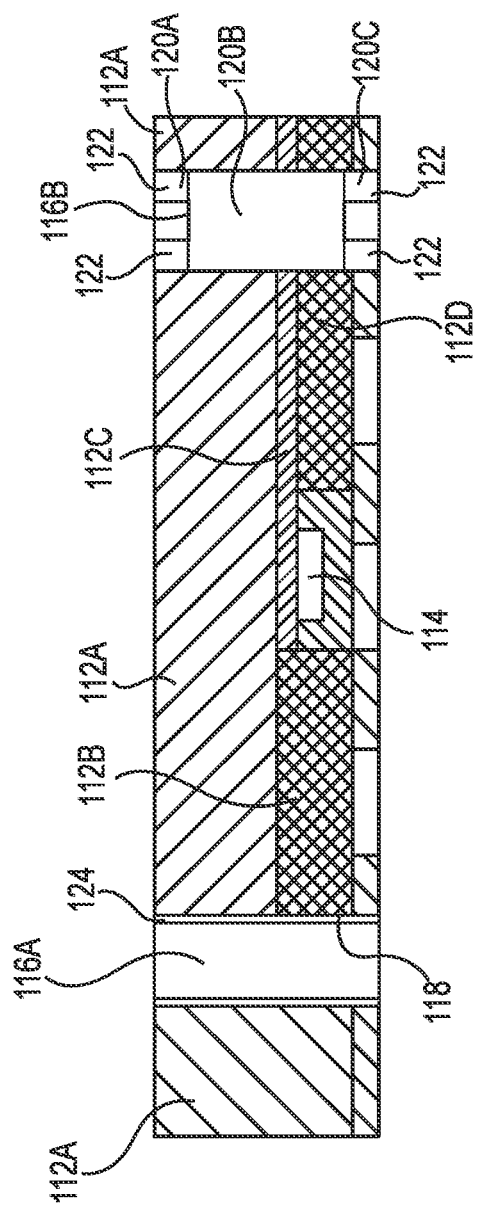
FIG. 6 is a cross-sectional view of an alternate socket housing in accordance with an embodiment of the present disclosure.

FIG. 6 illustrates an alternate socket housing 110 with a material sets 112A, 112B, 112C, 112D (collectively "112") varied by layer and within a given layer in accordance with an embodiment of the present disclosure. The thickness, shape, material content, location of the various materials 112 can be varied throughout the socket housing 110 as desired. Internal cavities 114, such as optical or RF waveguides, are also possible with the present method. Some of the layers can also be preformed and added to provide a contiguous surface so seal the internal cavities 114. Recesses 116A, 116B ("116") optional include plating 118 to electrically couple contact members (see e.g., FIG. 5) with one or more of the layers 112A, 112B in the socket housing 110.

In another embodiment, core 112A is made from a low-cost, bulk material, such as for example, LCP, FR4, or other printed circuit board materials. Holes 116 are drilled or molded using conventional techniques. At critical locations within the core 112A, dielectric materials 112B, 112C, 112D are added, such as for example by printing, and subsequently imaged to create a finer geometry to serve some purpose, such as retaining a contact member. In one embodiment, a series of layers of dielectric 120A, 120B, 120C are deposited in recess 116B, which are sequentially imaged to create a structures 122 used to retain contact members in the recess 116B. Structure 122 optionally includes features that cannot be molded or machined, such as undercuts. This approach permits the molded or machined core 112A with simple gross features, such as recesses 116, to be enhanced by adding the imaged dielectrics 112B, 112C, 112D.

In another embodiment, the printable dielectric materials 112B, 112C, 112D are a platable catalyst material that can subsequently be plated, such as with electro-less plating or sputtering techniques. Normally, plating does not adhere well to polymeric materials. The platable catalyst 112B, 112C, 112D is a dielectric material formulated so plating will stick, such as by impregnating the material with tiny metal particles, that can be plated directly with copper.

For example, material 112D is optionally a printed platable catalyst material onto which conductive circuit trace 112C is subsequently plated using electro-less plating or sputtering. The plating 112C is attracted to the platable catalyst 112D, but not other portions of the core 112A. The plating 112C can subsequently be etched to selectively remove some of the plated material. In another embodiment, printable dielectric material 124 can be coated on inside surface of recess 116A in preparation for receiving plating 118.

Any portion of the core 112A can be treated or printed with a printable plating catalyst to drive plating to desired locations. In one embodiment, the printable plating catalyst can be a surface coating over the entire core 112A, which is subsequently selectively removed in preparation for plating. Alternatively, bulk plating is applied to the entire core 112A and subsequently etched. A combination of both techniques can be used on a single core 112A.

Figure 7A:
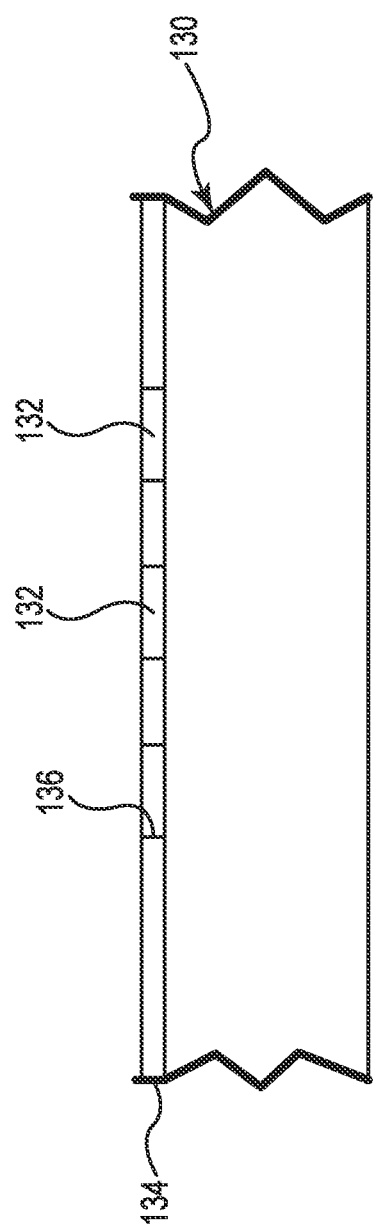
FIGS. 7A and 7B are cross-sectional views of an alternate method of making a socket housing in accordance with an embodiment of the present disclosure.
Figure 7B:
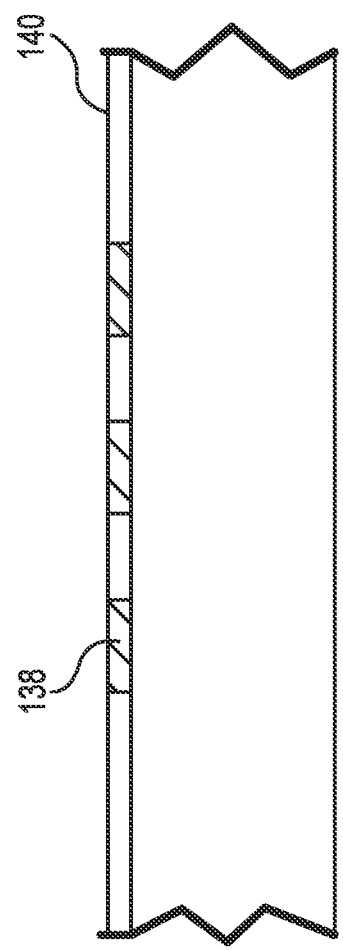

FIGS. 7A and 7B illustrates an alternate method of making socket housing 130 by sequentially removing patterned material 132 in accordance with an embodiment of the present disclosure. Patterned dielectric material 132 is removed from dielectric layer 134. The resulting recesses 136 are then filled or plugged with a dissolvable ore material 138 to create a planar surface 140 for subsequent layer application.

Figure 8:
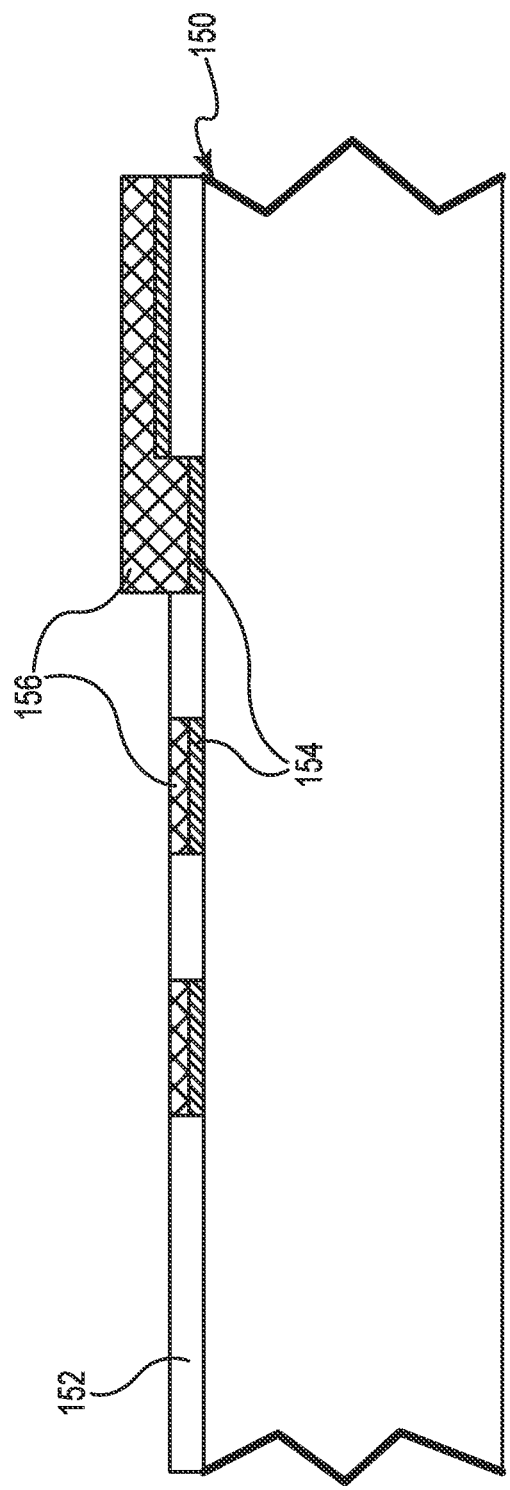
FIG. 8 illustrates an alternate socket housing in accordance with an embodiment of the present disclosure.

FIG. 8 illustrates an alternate method of making socket housing 150 in accordance with an embodiment of the present disclosure. Base substrate 152 is created and then placed into a mold to add material 154 using conventional molding technology. The resulting socket housing 150 creates desired function that is not possible to create with molding alone. The material set can also benefit from a wide variety of fillers that can provide function beyond a polymer alone, such as thermally conductive, magnetic, low or high k dielectrics, silicon, conductive or semiconductive materials, reinforcement, etc. As illustrated below, a plating catalyst or conductive/semiconductive target 154 can be applied to precisely locate conductive bulk metal material by plating 156 or combining with an etched or stamped lead frame.

FIG. 9 illustrates an alternate socket housing 180 with printed electrical devices 182 in accordance with an embodiment of the present disclosure. The electrical devices 182 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 182 optionally include printed LED indicator 184 and display electronics 186. Geometries can also be printed to provide capacitive coupling 188.

The electrical devices 182 are preferably printed during construction of the socket housing 180. The electrical devices 182 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 182 can be formed using printing technology, adding intelligence to the socket housing 180. Features that are typically located on other circuit members can be incorporated into the socket housing 180 in accordance with an embodiment of the present disclosure.

In one embodiment, the socket housing 180 is also constructed with recesses 190 that correspond to a desired circuit geometry 192. Metalizing layer is deposited in the recesses 190 to create circuit geometry 192. Metalizing can be performed by printing conductive particles followed by a sintering step, by printing conductive inks, or a variety of other techniques. The resulting metalized layer is preferably plated to improve conductive properties. The circuit geometry 192 is preferably of copper or similar metallic materials such as phosphor bronze or beryllium-copper. The plating is preferably a corrosion resistant metallic material such as nickel, gold, silver, palladium, or multiple layers thereof.

The recesses 190 permit control of the location, cross section, material content, and aspect ratio of the conductive traces in the circuit geometry 192. Maintaining the conductive traces with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 190 to control the aspect ratio of the conductive traces results in a more rectangular or square cross-section of the conductive traces in the circuit geometry 192, with the corresponding improvement in signal integrity.

In another embodiment, pre-patterned or pre-etched thin conductive foil circuit traces are transferred to the recesses 190. For example, a pressure sensitive adhesive can be used to retain the copper foil circuit traces in the recesses 190. The trapezoidal cross-sections of the pre-formed conductive foil traces are then post-plated. The plating material fills the open spaces in the recesses 190 not occupied by the foil circuit geometry, resulting in a substantially rectangular or square cross-sectional shape corresponding to the shape of the recesses 190.

In another embodiment, a thin conductive foil is pressed into the recesses 190, and the edges of the recesses 190 acts to cut or shear the conductive foil. The process locates a portion of the conductive foil in the trenches 190, but leaves the negative pattern of the conductive foil not wanted outside and above the trenches 190 for easy removal. Again, the foil in the trenches 190 is preferably post plated to add material to increase the thickness of the conductive traces in the circuit geometry 192 and to fill any voids left between the conductive foil and the recesses 190.

In another embodiment, layers 196 are selectively printed with a platable dielectric material onto which circuit geometry 192 is subsequently plated, as discussed above. In this embodiment, the recesses 190 are not required. An etching step can be used after the plating step to remove any unwanted plating 192 and/or to provide the plating with a desired cross-sectional shape.

Recesses 194 are optionally plated to electrically couple with the electrical devices 182 or the circuit geometry 192. As discussed above, recesses 194 are optionally coated with a platable dielectric material that is subsequently plated.

The availability of printable silicon inks provides the ability to print electrical devices 182 such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 182 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

FIG. 10 illustrates an alternate socket housing 200 in accordance with an embodiment of the present disclosure. Optical fibers 202 are located between layers 204, 206 of dielectric material. In one embodiment, optical fibers 202 is positioned over printed compliant layer 208, and dielectric layer 210 is printed over and around the optical fibers 202. A compliant layer 212 is preferably printed above the optical fiber 202 as well. The compliant layers 208, 212 permit displacement of the optical fibers 202 to facilitate coupling to other devices. In another embodiment, the dielectric layer 210 is formed or printed with recesses into which the optical fibers 202 are deposited.

In another embodiment, optical quality materials 214 are printed during printing of the socket housing 200. The optical quality material 214 and/or the optical fibers 202 comprise optical circuit geometries. The printing process allows for deposition of coatings in-situ that enhance the optical transmission or reduce loss. The precision of the printing process reduces misalignment issues when the optical materials 214 are optically coupled with another optical structure.

In another embodiment, embedded coaxial RF circuits 214 or printed micro strip RF circuits 214 are located with dielectric/metal layers 204, 206, 210. These RF circuits 214 are preferably created by printing dielectrics and metallization geometry.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A socket housing comprising:
    a housing including a plurality of dielectric layers including at least two different dielectric materials, the housing comprising a material sets varied by layer and within a given layer, such that the housing comprises a three-dimensional dielectric structure having of a variety of dielectric properties;
    at least one contact member positioned in a plurality of recesses in the housing, distal ends of the contact members adapted to electrically couple with circuit members;
    plating in at least one of the recesses to electrically couple a contact member with at least one of the conductive traces;
    at least one of a conductive, a non-conductive, or a semi-conductive material in at least one of the layers that tune the impedance of the contact members; and
    a plurality of conductive traces extending along at least one layer of the housing.

2. The socket housing of claim 1 wherein the recesses comprise at least one feature that mechanically retains the contact members in the housing.

3. The socket housing of claim 1 wherein the housing includes a structure with features that cannot be molded or machined.

4. The socket housing of claim 1 comprising at least one printed electrical device on one or more of a dielectric layer in the housing.

5. The socket housing of claim 1 wherein the housing includes one or more of embedded circuitry, shielding, passive or active components, antennae, decoupling, power filtering, signal conditioning, magnetic or dielectric enhancement, impedance control, transistors, LEDs, test or probe points, memory, located between dielectric layers.

6. The socket housing of claim 1 comprising an optical quality material located between the dielectric layers in the housing.

7. The socket housing of claim 1 wherein one or more of the contact members extend above the housing.

8. An electrical interconnect assembly comprising:
    the socket housing of claim 1;
    a first circuit member comprising electrical terminals compressively engaged with contact members located along a first surface of the socket housing; and
    a second circuit member comprising electrical terminals compressively engaged with contact members located along a second surface of the socket housing.

9. The electrical interconnect assembly of claim 8 wherein the first and second circuit members are selected from one of a dielectric layer, a printed circuit board, a flexible circuit, a bare die device, an integrated circuit device, organic or inorganic substrates, or a rigid circuit.

10. A method of making a socket housing comprising the steps of:
    forming a housing including a plurality of dielectric layers including at least two different dielectric materials, the housing comprising a material sets varied by layer and within a given layer, such that the housing comprises a three-dimensional dielectric structure having of a variety of dielectric properties;
    locating at least one contact member in a plurality of recesses in the housing, distal ends of the contact members adapted to electrically couple with circuit members;

plating at least one of the recesses to electrically couple the contact member with at least one of the conductive traces;

depositing at least one of a conductive, a non-conductive, or a semi-conductive materials in at least one of the layers that tune the impedance of the contact members; and forming a plurality of conductive traces extending along at least one layer of the housing.

11. The method of claim 10 comprising printing at least one feature that mechanically retains the contact members in the recesses.

12. The method of claim 10 comprising:

printing a platable dielectric material on selected areas of the socket housing; and plating the platable dielectric material.

13. The method of claim 10 comprising printing at least one electrical device on one or more of a dielectric layer in the housing.

14. The method of claim 10 comprising printing one or more of circuitry, shielding, passive or active components, antennae, decoupling, power filtering, signal conditioning, magnetic or dielectric enhancement, impedance control, transistors, LEDs, test or probe points, memory, on a dielectric layer in the housing.

15. A method of making an electrical interconnect assembly comprising the steps of:

compressively coupling electrical terminals on a first circuit member with contact members located along a first surface of the socket housing of claim 10; and compressively coupling electrical terminals on a second circuit member with contact members located along a second surface of the socket housing.

* * * * *